United States Patent [19]
Mondal et al.

[11] Patent Number: 5,912,828
[45] Date of Patent: *Jun. 15, 1999

[54] EQUALIZER FILTER CONFIGURATION FOR PROCESSING REAL-VALUED AND COMPLEX-VALUED SIGNAL SAMPLES

[75] Inventors: Kalyan Mondal, Berkeley Heights; Kalavai Janardhan Raghunath, Chatham, both of N.J.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/581,634

[22] Filed: Dec. 28, 1995

[51] Int. Cl.$^6$ ..................................................... G06F 17/10
[52] U.S. Cl. .................................. 364/724.2; 364/724.19; 375/232
[58] Field of Search ........................... 364/724.2, 724.19; 348/607; 358/21; 235/156; 375/14, 94, 232

[56] References Cited

U.S. PATENT DOCUMENTS

| | | | |
|---|---|---|---|
| 3,992,616 | 11/1976 | Acker | 235/156 |
| 4,949,168 | 8/1990 | Ninomiya et al. | 358/21 |
| 5,091,864 | 2/1992 | Baji et al. | 395/27 |
| 5,225,836 | 7/1993 | Morley, Jr. et al. | 341/150 |
| 5,243,624 | 9/1993 | Paik et al. | 375/14 |
| 5,315,619 | 5/1994 | Bhatt | 375/94 |
| 5,388,062 | 2/1995 | Knutson | 364/724.2 |
| 5,502,507 | 3/1996 | Kim | 348/607 |
| 5,528,311 | 6/1996 | Lee et al. | 348/607 |

OTHER PUBLICATIONS

Long, Guozhu, Fuyun Ling and John G. Proakis, "The LMS Algorithm with Delayed Coefficient Adaptation," *IEEE Transactions on Acoustics, Speech and Signal Processing*, vol. 37, No. 9, Sep. 1989, pp. 1397–1405.

Weste, Neil H.E. and Kamran Eshraghian, *Principles of CMOS VLSI Design: A Systems Perspective*, Chapter 9 CMOS System Design Examples, 9.3 "A TV Echo Canceller," pp. 672–694, AT&T, U.S.A. 1993.

Lee, Edward A. Lee and David G. Messerschmitt, *Digital Communication*, 9.2 "Adaptive Linear Equalizer," pp. 385–394, Kluwer Academic Publishers, Boston, 1988.

Simon Haykin, *Adaptive Filter Theory*, Second Edition, "Stochastic Gradient–Based Algorithms," Chapter 9, pp. 299–307, Prentice Hall, Englewood Cliffs, NJ.

*Primary Examiner*—Emmanuel L. Moise

[57] ABSTRACT

An apparatus and method of implementing an equalizer filter configuration including a plurality of memory blocks and a plurality of filter blocks. The respective pluralities of memory blocks and filter blocks are coupled so that the equalizer filter configuration has the capability to process input signal samples. The input signal samples include signal samples selected from the group consisting essentially of complex-valued signal samples and real-valued signal samples.

16 Claims, 4 Drawing Sheets

| SIGNAL SAMPLE FROM RAM | $X_r(n-0.5)$ | $X_i(n-0.5)$ | $X_r(n-1.5)$ | $X_i(n-1.5)$ | $X_r(n)$ | $X_i(n)$ | $X_r(n-1.0)$ | $X_i(n-1.0)$ |
|---|---|---|---|---|---|---|---|---|
| COEFFICIENT SIGNAL PROVIDED BY MUX 30 | $C_{r1}$ | $C_{i1}$ | $C_{r3}$ | $C_{i3}$ | $C_{r0}$ | $C_{i0}$ | $C_{r2}$ | $C_{i2}$ |
| COEFFICIENT SIGNAL PROVIDED BY MUX 40 | $C_{i1}$ | $C_{r1}$ | $C_{i3}$ | $C_{r3}$ | $C_{i0}$ | $C_{r0}$ | $C_{i2}$ | $C_{r2}$ |
| CLOCK CYCLES | 1 | 2 | 3 | 4 | 5 | 6 | 7 | 8 |

*FIG. 6*

EQUALIZER FILTER CONFIGURATION FOR PROCESSING REAL-VALUED AND COMPLEX-VALUED SIGNAL SAMPLES

RELATED APPLICATIONS

This patent application is related to concurrently filed U.S. patent application Ser. No. 08/581,637, entitled "Update Block For An Adaptive Equalizer Filter Configuration," filed Dec. 28, 1995, and concurrently filed U.S. patent application Ser. No. 08/581,635, entitled "Update Block For An Adaptive Equalizer Filter Configuration Capable Of Processing Complex-Valued Coefficient Signals," filed Dec. 28, 1995 now U.S. Pat. No. 5,805,481, both assigned to the assignee of the present invention and herein incorporated.

TECHNICAL FIELD

The invention relates to digital signal filter architectures and, more particularly, to equalizer filter architectures or configurations.

BACKGROUND OF THE INVENTION

Equalizer filters, and particularly adaptive equalizer filters, are well-known and used in a variety of applications. See, for example, *Adaptive Filter Theory*, by S. Haykin, available from Prentice-Hall, Inc., Englewood Cliffs, N.J., 1992, herein incorporated by reference. In high definition television (HDTV), for example, equalizer filters or equalizer filter configurations may be employed to reduce intersymbol interference (ISI) that may appear as ghosts in a received video signal, for example. For an equalizer filter employing a predetermined number of taps, a trade-off exists between the span of the filter and its ability to reduce the amount of ghosting or intersymbol interference (ISI) present in the received signal. An equalizer filter or equalizer filter configuration having the capability to take advantage of this trade-off may be desirable.

SUMMARY OF THE INVENTION

Briefly, in accordance with one embodiment of the invention, an equalizer filter configuration comprises: a plurality of memory blocks; and a plurality of filter blocks. The respective pluralities of memory blocks and filter blocks are coupled so that the equalizer filter configuration has the capability to process input signal samples, the input signal samples comprising signal samples selected from the group consisting essentially of complex-valued signal samples and real-valued signal samples.

Briefly, in accordance with another embodiment of the invention, a method of implementing an equalizer filter for processing complex-valued signal samples at a substantially predetermined signal sample rate comprises the steps of: providing current and selectively delayed real-valued and imaginary-valued signal sample components to the respective multipliers of two multiply-accumulate units; applying selected complex-valued coefficient signal components to the respective multipliers; and operating the two multiply-accumulate units so as to implement a predetermined number of taps of the equalizer filter in which a first unit of the two multiply-accumulate units produces a real-valued output signal and a second unit of the two multiply-accumulate units produces an imaginary-valued output signal.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof, may best be understood by reference to the following detailed description when read with the accompanying drawings in which:

FIG. 6 is a table illustrating the timing of selected coefficient signals in relation to signal sample components for a given sample period for the portion of an embodiment illustrated in FIG. 1.

DETAILED DESCRIPTION

Figure 3:
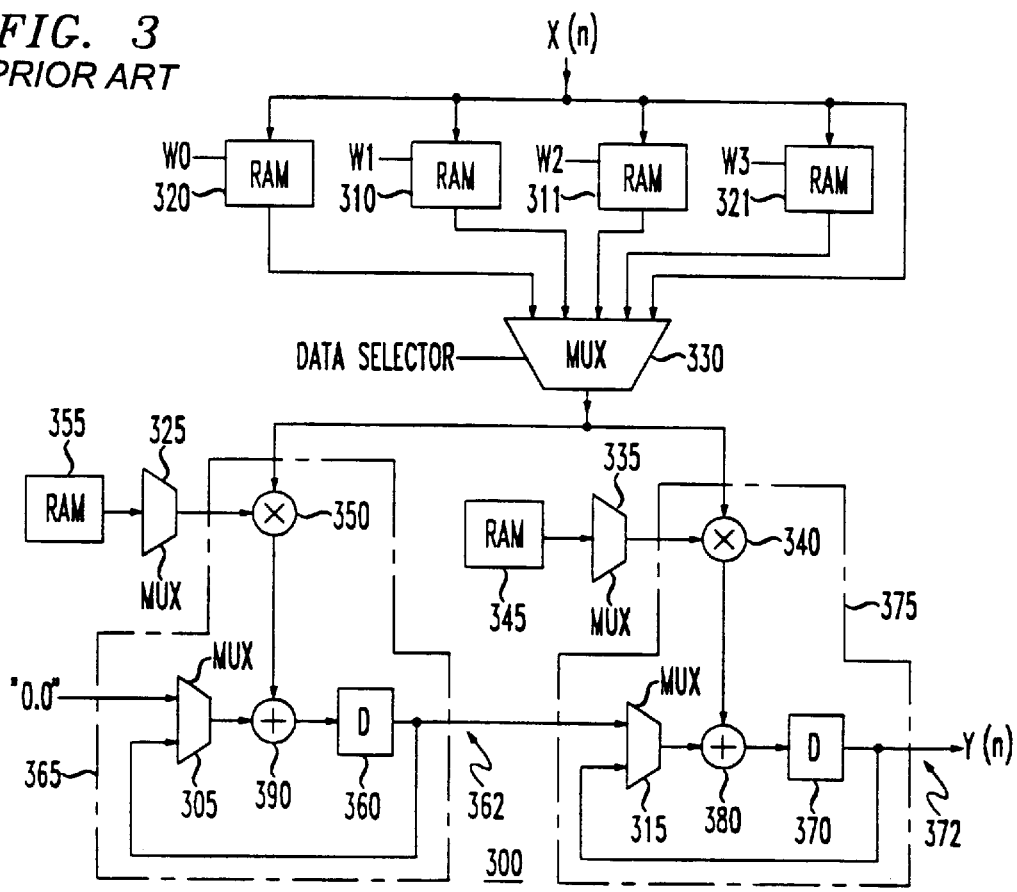
FIG. 3 is a schematic diagram illustrating an implementation of an equalizer filter configuration and random access memory (RAM) architecture for processing real-valued signal samples.

Equalizer filters, such as adaptive equalizer filters, are well-known. FIG. 3 is a block diagram illustrating an implementation 300 of a random access memory-based (RAM-based) architecture for an equalizer filter or equalizer filter configuration. As illustrated, discrete signal samples, designated X(n), become available periodically. Depending upon the particular application, such as for high definition television (HDTV), for example, the discrete signal samples may be obtained by downconverting a radio frequency (RF) signal to produce an analog signal and then performing analog-to-digital (A/D) conversion at a substantially predetermined signal sample rate. Typically, the digital signal samples comprise a predetermined number of binary digital signals, such as 10 bits, for example, provided in a parallel, twos complement format, for example. Of course, the invention is not restricted in scope in this respect. After A/D conversion, a plurality of real-valued digital signal samples may be provided, such as for vestigial sideband modulation (VSB).

These digital signal samples are available at a substantially predetermined signal sample rate. For example, in this implementation, assume that the signal sample rate is 10 MHz. If the multiply-accumulate (MAC) units, such as for filter block 365 and filter block 375, illustrated in FIG. 3, operate at 40 MHz, then this implementation may be employed to realize an 8-tap equalizer filter. It is noted, therefore, that in this implementation the clock frequency is an integer multiple of the signal sample rate. For example, each MAC unit may implement four equalizer filter taps because the clock frequency of the MAC unit is four times faster than the signal sample rate in this particular implementation.

For the implementation illustrated in FIG. 3, assume RAMs 310, 320, 311, and 321, each include two memory locations. As each discrete signal sample arrives at the 10 MHz rate, that signal sample may be written to a memory location in one of the RAMs and, likewise, the signal sample stored in that memory location may then be provided to MUX 330 and ultimately to filter blocks 365 and 375. Thus, in this particular implementation, currently available signal samples, designated X(n), may be provided via MUX 330 and delayed signal samples designated, for example, as X(n−2), X(n−4), and X(n−6), may also be provided via MUX 330. As explained in more detail hereinafter, the following expressions illustrate partial sums that may be respectively developed by filter block 365 and filter block 375 at output ports 362 and 372, respectively.

Filter Block 365: output signal $(n+1)=C_1X(n)+C_3X(n-2)+C_5X(n-4)+C_7X(n-6)$

Filter Block 375: output signal $(n+1)=C_0X(n)+C_2X(n-2)+C_4X(n-4)+C_6X(n-6)+365\ OS(n)$ (1)

where 365 OS(n)=the Filter Block 365 output signal at sample period n. Each filter block receives four signal samples via MUX 330 during a signal sample period. Therefore, in this implementation the MAC units, operating at 40 MHz, may each form four products in that time, as illustrated by expressions (1) above. Thus, for example, referring to the MAC unit of filter block 365, signal sample X(n) is provided to multiplier 350. Likewise, coefficients stored as signals in RAM 355, such as $C_1$, $C_3$, $C_5$ and $C_7$, are provided to multiplier 350 via MUX 325. The output signal of multiplier 350 is then provided to adder 390. The sum of the signal provided by multiplier 350 and the signal provided via MUX 305 is then provided by adder 390 to delay unit 360. In this particular case, MUX 305 provides a zero signal, as illustrated in FIG. 3. Therefore, the signal value provided to delay unit 360 is the product, $C_1X(n)$. Because the MAC units are operating at a clock frequency four times that of the signal sample rate, MUX 330 may then provide a delayed signal sample, such as X(n−2) from RAM 321, for example. Again, this is provided to multiplier 350. RAM 355 then provides a signal for a coefficient, such as $C_3$, via MUX 325 to multiplier 350. The product, $C_3X(n-2)$, for example, is then produced by multiplier 350 and provided as a signal to adder 390. Likewise, delay unit 360 then provides the previous product, stored as a signal, to MUX 305 so that it may be summed by adder 390 with the signal just produced by multiplier 350. Thus, the partial sum, $C_1X(n)+C_3X(n-2)$, for example, is then provided to delay unit 360. This process is continued to obtain the expression for the output signal of filter block 365 provided in (1). Likewise, this partial sum is provided as the output signal of filter block 365 to the MAC unit of filter block 375 via port 362. It is noted that the MAC unit of filter block 375 also receives input signal samples X(n), X(n−2), X(n−4), and X(n−6) which are applied to a multiplier 340. Thus, while the MAC unit of filter block 365 is computing a partial sum, the MAC unit of filter block 375 is also computing a partial sum. However, RAM 345 in this implementation stores different coefficient signals, such as for $C_0$, $C_2$, $C_4$, and $C_6$, for example. A RAM 345 then provides a signal for a coefficient, such as $C_6$, via a MUX 335 to the multiplier 340. The product, $C_6X(n-6)$, for example, is then produced by the multiplier 340 and provided as a signal to an adder 380. Likewise, the delay unit 370 then provides the previous product, stored as a signal, to a MUX 315 so that it may be summed by the adder 380 with the signal just produced by the multiplier 340. Thus, the partial sum, $C_0X(n)+C_6X(n-6)$, for example, is then provided to the delay unit 370. Furthermore, the partial sum computed by block 365 is then provided to filter block 375 via MUX 315. This is consistent with expressions (1). Furthermore, in this implementation, the output signal provided by the MAC unit of filter block 375 is also the equalizer filter output signal, Y(n). This may be summarized in accordance with the following equation.

$Y(n)=C_7X(n-7)+C_6X(n-6)+C_5X(n-5)+C_4X(n-4)+C_3X(n-3)+C_2X(n-2)+C_1X(n-1)+C_0X(n)$ (2)

It is noted previously that RAMs 355 and 345 store as signals the coefficients for the equalizer filter. Alternately, these RAMs may be updated with signals providing updated coefficients so that an adaptive equalizer may be implemented. Typically, updating of the coefficients is performed "off-line" and is based, at least in part, on an error signal or error signal samples produced by comparing the output signal of the adaptive equalizer with the output signal of a slicer. However, an equalizer filter in accordance with the invention is not restricted in scope in this respect. Furthermore, alternatively, an update block may be employed, such as described in aforementioned concurrently filed U.S. patent application Ser. No. 08/581,637 or Ser. No. 08/581,035 now U.S. Pat. No. 5,805,481, although, again, the invention is not restricted in scope in this respect.

One disadvantage of the approach illustrated in FIG. 3 is that the equalizer filter shown will only process real-valued input signal samples. However, in a number of applications, it would be desirable if an equalizer filter had the capability to process either real-valued or complex-valued signal samples, depending upon the signal samples applied to the equalizer filter. For example, in digital TV, both quadrature amplitude modulation (QAM) and vestigial sideband modulation (VSB) may be employed. The former type of modulation produces complex-valued signal samples, whereas the latter type produces real-valued signal samples. The difficulty is that each approach typically employs a different equalizer filter configuration or architecture. Thus, a filter architecture having the capability to perform both types of signal processing without introducing a significant amount of additional hardware complexity or overhead would be desirable.

Figure 1:
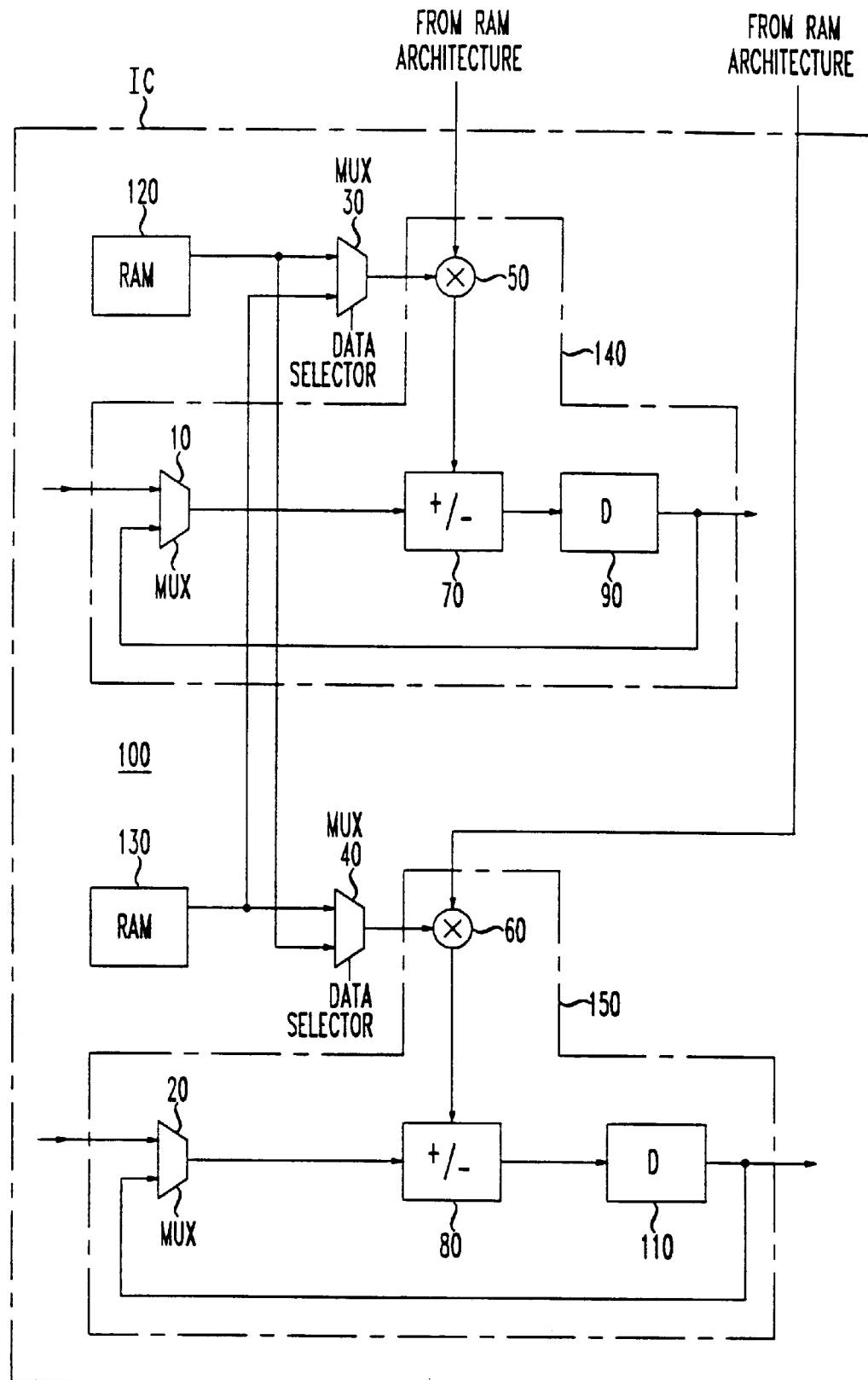
FIG. 1 is a schematic diagram illustrating a portion of an embodiment of an equalizer filter configuration in accordance with the invention.
Figure 2:
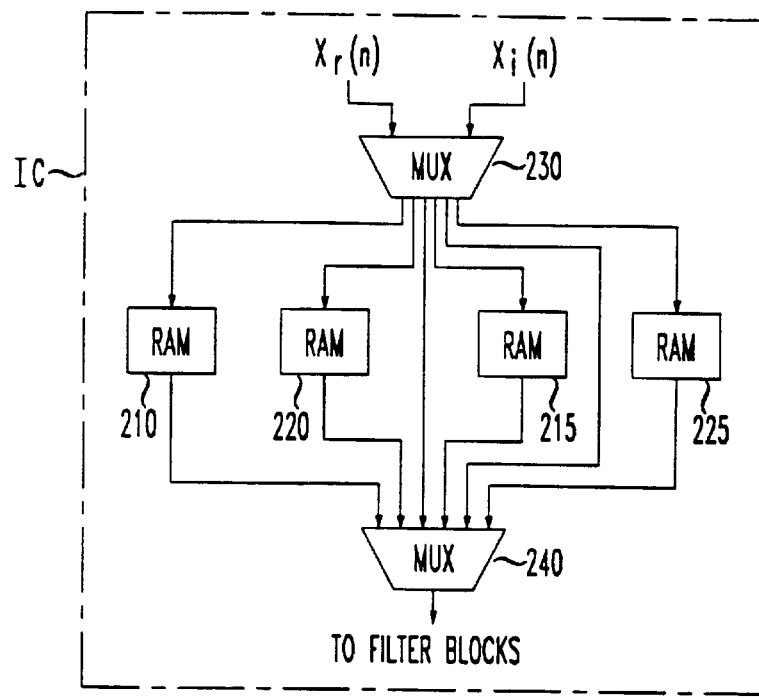
FIG. 2 is a schematic diagram illustrating an embodiment of a random access memory (RAM) architecture for use in conjunction with the portion of an embodiment shown in FIG. 1.

FIG. 1 is a block diagram of a portion of an embodiment 100 of an equalizer filter or equalizer filter configuration in accordance with the invention. Embodiment 100 is illustrated as embodied on an integrated circuit (IC), although the invention is not restricted in scope in this respect. An embodiment of a RAM architecture that may be employed with this portion is illustrated in FIG. 2. Embodiment 100, shown in FIG. 1, has an architecture that allows the equalizer filter to process both real-valued signal samples and complex-valued signal samples, as described in more detail hereinafter. Assume in this particular embodiment that the complex-valued signal samples arrive at a 5 MHz rate, although the invention is not limited in scope in this respect. It will, of course, be appreciated that this signal sample rate provides an equivalent bit rate to the bit rate of the equalizer filter of FIG. 3, even though the signal sample rate is half of the signal sample rate for the filter configuration shown in FIG. 3. This follows, for example, for situations in which the imaginary-valued signal sample components and the real-valued signal sample components of the complex-valued signal samples for the configuration of FIG. 1 each employ the same number of bits as the real-valued signal samples processed by the equalizer filter configuration of FIG. 3. Likewise, as illustrated by the embodiment shown in FIG. 1, this particular embodiment of a filter block includes two MAC units, 140 and 150, whereas for the implementation shown in FIG. 3, a single MAC unit is employed for each filter block. Nonetheless, embodiment 100 shown in FIG. I may be employed to operate like the implementation shown in FIG. 3 based upon the use of MUXes 30 and 40 in FIG. 1. Thus, it has the capability to process both real-valued and complex-valued signal samples, as explained in more detail hereinafter.

MUXes 30 and 40 include a data selector that may be employed to select RAM 120 for MUX 30 and RAM 130 for MUX 40 so that MAC units 140 and 150 may each correspond to respective filter blocks of an equalizer filter for processing real-valued signal samples, such as filter block 365 and filter block 375 shown in FIG. 3, for example. However, the embodiment shown in FIG. 1 also has the additional capability to perform processing for complex-valued signal samples, which the embodiment shown in FIG. 3 does not have the capability to perform. When the embodiment shown in FIG. 1 is operated in this complex-valued signal sample processing mode, MAC unit 140 provides a real-valued output signal sample whereas MAC unit 150 provides an imaginary-valued output signal sample. Furthermore, MAC unit 140 via MUX 30 may obtain coefficient signals from RAM 120 or RAM 130 and, likewise, for MAC unit 150 via MUX 40, as explained in more detail hereinafter. In this embodiment, therefore, embodiment 100 comprises a filter block including two mutually-coupled MAC units. Each of the two mutually-coupled MAC units includes a MUX that mutually couples the MAC units so that the MAC units include the capability to share multiplier or coefficient signals stored in the RAMs of the two respective MAC units. Of course, the invention is not limited in scope in this respect.

For an equalizer filter in accordance with the invention to have the capability to process complex-valued signal samples, it should have the ability to process signal samples and coefficient signals in accordance with the following form.

$$Y(n) = Y_r(n) + jY_i(n) \quad (3)$$

$$X(n) = X_r(n) + jX_i(n)$$

$$C_k = C_{rk} + jC_{ik}$$

where $X(n)$ are the input signal samples, $Y(n)$ are the output signal samples, and $C_k$ are the coefficient signals. Likewise, $Y_r(n)$, $X_r(n)$ and $C_{rk}$ represent real-valued components and $Y_i(n)$, $X_i(n)$, and $C_{ik}$ represent imaginary-valued components of the respective signal samples and signals. Consider, for example, an N-tap equalizer filter for quadrature amplitude modulation (QAM), N being a positive integer, where T/2 sampling is employed, T being the sample period. Therefore, a fractionally spaced linear equalizer (FSLE) is employed, although the invention is not limited in scope in this respect. For the implementation of FIG. 1, N is 4 complex taps, in comparison with the 8 real taps for the implementation of FIG. 3. Thus, to employ an architecture with the same number of MAC units and substantially the same clock frequency to implement a FSLE capable of processing complex-valued signal samples, for example, $Y(n)$ should have the following form.

$$Y(n)+C_{r0}X(n)+C_1X(n-0.5)+C_2X(n-1)+C_3X(n-1.5) \quad (4)$$

Therefore, although the same number of MAC units may be employed, the span of the filter is less in this example. Furthermore, where the coefficient signals and the input signal samples have the form of equations (3) above, the output signal samples, $Y(n)$, may be expressed in real-valued and imaginary-valued components in accordance with the following equations.

$$Y_r(n)=C_{r0}X_r(n)-C_{i0}X_i(n)+C_{r1}X_r(n-0.5)-C_{i1}X_i(n-0.5)+C_{r2}X_r(n-1)-C_{i2}X_i(n-1)+C_{r3}X_r(n-1.5)-C_{i3}X_i(n-1.5)$$

$$Y_i(n)=C_{r0}X_i(n)+C_{i0}X_r(n)+C_{r1}X_i(n-0.5)+C_{i1}X_r(n-0.5)+C_{r2}X_i(n-1)+C_{i2}X_r(n-1)+C_{r3}X_i(n-1.5)+C_{i3}X_r(n-1.5) \quad (5)$$

Therefore, the real-valued and imaginary-valued components for the output signal samples of a filter block of an equalizer filter capable of processing complex-valued signal samples may have the following form.

$$RTAP100(n-1)=C_{r0}X_r(n)-C_{i0}X_i(n)+C_{r1}X_r(n-0.5)-C_{i1}X_i(n-0.5)+C_{r2}X_r(n-1)-C_{i2}X_i(n-1)+C_{r3}X_r(n-1.5)-C_{i3}X_i(n-1.5)$$

$$ITAP100(n+1)=C_{r0}X_i(n)+C_{i0}X_r(n)+C_{r1}X_i(n-0.5)+C_{i1}X_r(n-0.5)+C_{r2}X_i(n-1)+C_{i2}X_r(n-1)+C_{r3}X_i(n-1.5)+C_{i2}X_i(n-1.5) \quad (6)$$

where RTAP 100 is the output signal sample produced by MAC unit 140 and ITAP100 is the output signal sample produced by MAC unit 150 in this particular example. These equations may be implemented by the embodiment shown in FIG. 1.

Of course, the invention is not limited in scope to implementing these particular equations or this particular equalizer filter. The embodiment of FIG. 1 merely illustrates an architecture in accordance with the invention for implementing a complex four tap equalizer filter. Likewise, the invention is not limited in scope to MAC units having the precise structure of MAC units 140 and 150. Other embodiments of an MAC unit may provide satisfactory performance. Nonetheless, embodiment 100 of an equalizer filter configuration in accordance with the invention is flexible and includes the capability to process both real-valued and complex-valued signal samples. One skilled in the art will now appreciate that this architecture may be extended in a variety of ways including: number of RAMs, clock frequency, signal sample rate, number of filter taps, number of filter blocks, and number of MAC units, to name only a few possible variations. For example, the previous embodiment implements a 4 tap complex T/2 filter. Nonetheless, it may be extended to any size filter, including multiples of four, as illustrated. A 64-tap complex filter, for example, may employ 4 RAMs, each of size 32, and 16 complex filter blocks.

Figure 4:
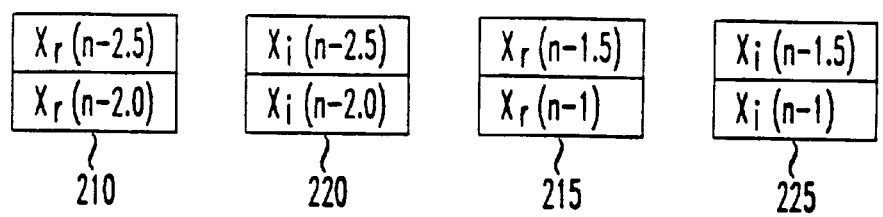
FIG. 4 is a schematic diagram illustrating the memory locations of signal sample components in RAM for the embodiment illustrated in FIG. 2
Figure 5:
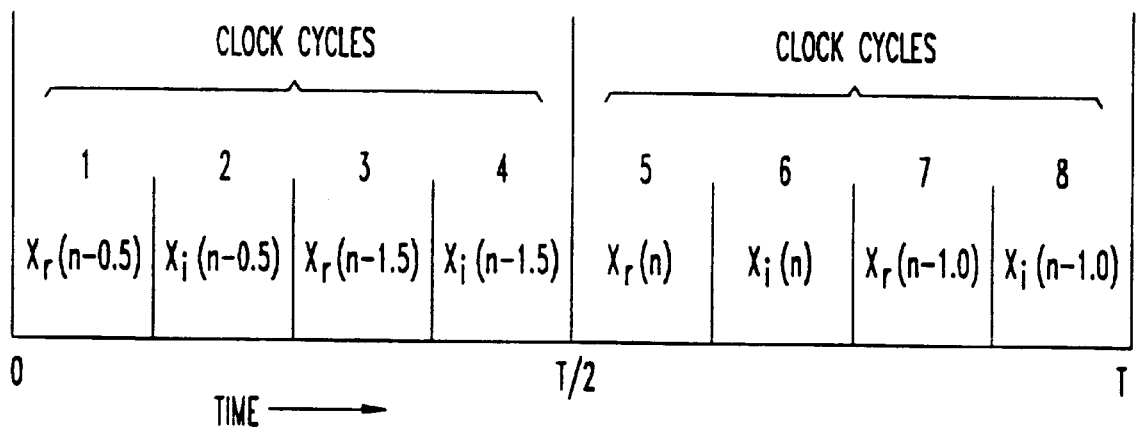
FIG. 5 is a timing diagram illustrating the timing of multiplexing of signal sample components for a given signal sample period for the portion of an embodiment illustrated in FIG. 1.

In order to take advantage of the timing regarding the availability of signal samples, as illustrated by the portion of the embodiment shown in FIG. 2, complex-valued signal samples that are provided to MUX 230 are written to RAMs 210, 220, 215, and 225. The signal samples stored in the respective RAMs are then provided to MUX 240 for the filter blocks, such as embodiment 100 illustrated in FIG. 1. Because, as previously explained, the signal sample rate for the complex-valued signal samples is half of the rate for the implementation illustrated in FIG. 3, although the signal samples are fractionally-spaced, sufficient time is provided to read and write the real-valued and imaginary-valued components of the signal samples. Thus, during a signal sample period of a complex-valued signal sample, eight multiply operations may be performed in this particular embodiment, for example. First, the complex-valued signal sample may be made available, via MUX 230 and MUX 240, to embodiment 100, illustrated in FIG. 1. For example, first a signal sample component, such as a real-valued component, $X_r(n-0.5)$, for example, may be provided via MUX 240 to multipliers 50 and 60 and then on the next clock cycle of the MAC units, which is eight times the signal sample rate, another signal sample component, such as the imaginary-valued component, $X_i(n-0.5)$, for example, may be provided via MUX 240 to multipliers 50 and 60. The real-valued and imaginary-valued signal component of this complex-valued signal sample may then be written into the RAMs and the real and imaginary-valued signal components of a signal sample stored in a selected memory location may then be read from the RAMs and provided by MUX 240, again to embodiment 100 illustrated in FIG. 1. These signal components have been effectively delayed by storage in the RAM. For example, signal components for $X_r(n-1.5)$ and $X_i(n-1.5)$, as illustrated in FIG. 4, may be read from the RAMs. Therefore, on the next clock cycle, the real-valued component, $X_r(n-1.5)$, for example, may be provided to multipliers 50 and 60, and, on yet another clock cycle, the imaginary-valued component, $X_i(n-1.5)$, for example, may be provided. This process may then be repeated for signal sample components $X_r(n)$, $X_i(n)$, $X_r(n-1)$, and $X_i(n-1)$. As described above regarding the signal sample components, components $X_r(n)$ and $X_i(n)$ become available via MUXes 230 and 240, are stored in the RAMs, and then components $X_r(n-1)$ and $X_i(n-1)$ are read from the RAMs. One possible sequence of multiplexing of component signal samples during a signal sample period for the embodiment of FIGS. 1 and 2 is illustrated in FIG. 5. Thus, FIG. 5 illustrates the signal sample components provided via MUX 240 to multipliers 50 and 60 during eight clock cycles synchronized with a single signal sample period for this particular embodiment. FIG. 4 illustrates a possible memory map of RAMs 210, 220, 215 and 225 for the delayed signal sample components. Likewise, in this embodiment, RAM 120 and RAM 130 respectively contain the real-valued and imaginary-valued components of the complex-valued coefficient signals that may be provided via MUXes 30 and 40 to multipliers 50 and 60 to ensure that the proper product-signal is formed by multipliers 50 and 60. FIG. 6, for example, is a table illustrating the real-valued and imaginary-valued coefficient signals to be provided via MUXes 30 and 40 for processing with the various real-valued and imaginary-valued signal components provided via MUX 240. The top row corresponds to the signal sample components shown in FIG. 5 and the next two rows provide the coefficient signal components provided by the designated MUX for processing by a multiplier with the particular signal sample component. Likewise, these output signals are provided to adder-subtracters 70 and 80, illustrated in FIG. 1. It is noted that 70 and 80 perform both addition and subtraction in this particular embodiment so that products of a coefficient signal component and a signal sample component having a negative coefficient signal may be suitably handled. Therefore, after multipliers 50 and 60 form products, some of the resulting signals are subtracted rather than added, in accordance with equations (6) in this particular embodiment. For example, the adder-subtracter may include digital circuitry so that the binary digital signals are stored in twos complement and bit manipulation may be employed, although the invention is not restricted in scope in this respect. For example, a simple adder may be employed and separate circuitry to perform the bit manipulation may also be employed.

FIGS. 4, 5 and 6 are, of course, merely provided to illustrate the operation of a particular embodiment. An equalizer filter configuration in accordance with the invention is not limited to the operation depicted by these figures. The embodiment illustrated in FIGS. 1 and 2 includes the capability to process real-valued signal samples without adding or modifying the architecture of the component blocks; however, it will now be appreciated that in the mode of operation in which real-valued signal samples are processed, the location of signal samples in memory and the multiplexing of signal samples and coefficients will not be in accordance with FIGS. 4, 5 and 6. Instead, these aspects of the operation of this particular embodiment will be similar to the approach described in conjunction with FIG. 3. For example, signal samples are provided to MUX 230 at the 10 MHz rate along the signal path designated $X_r(n)$ in FIG. 1, for this particular embodiment. Likewise, control signals may be employed, such as provided to MUXes 30, 40, 230 and 240, as examples, to ensure that real-valued signal samples are processed in the appropriate manner.

As illustrated in FIG. 1, the output signal produced by adder-subtracters 70 and 80 may be provided to a delay unit, such as delay units 90 and 110, so that on the next clock cycle, the output signal produced by multipliers 50 and 60, via MUXes 10 and 20, may be added to or subtracted from the output signal produced by adder-subtracters 70 and 80. Of course, typically, control signals are provided to ensure that subtraction occurs at the appropriate instance in accordance with the previous equations, such as equations (6). Thus, in this way, after eight clock cycles of the MAC units or one signal sample period, delay units 90 and 110 may provide to the next filter block, in these embodiments employing multiple filter blocks, output signals. Thus, as discussed with respect to FIG. 3, for the portion of the embodiment illustrated in FIG. 1, a plurality of filter blocks may be operating in parallel receiving the same signal sample components from RAM, but applying different coefficient signals at each filter block to implement the equalizer filter configuration. Likewise, MUXes 30 and 40 are employed because each MAC unit, such as MAC units 140 and 150, require both the real-valued and imaginary-valued components for the coefficients, such as $C_0$, $C_1$, $C_2$, and $C_3$, in this embodiment. This is illustrated by the table in FIG. 6, for example. However, to conserve memory, each RAM unit only stores the real-valued or imaginary-valued component for the four coefficients. Of course, alternatively, each RAM may store both components for two of the four coefficients, again utilizing MUXes 30 and 40.

An equalizer filter configuration in accordance with the invention, such as embodiment 100 illustrated in FIG. 1, for example, may be operated in accordance with the following method. As previously described, current and selectively delayed real-valued and imaginary-valued signal sample components may be provided to the respective multipliers of two multiply-accumulate units, such as MAC units 140 and 150 illustrated in FIG. 1. Thus, as previously described and illustrated, these signal sample components are provided to multipliers 50 and 60 via MUX 240, for example. Likewise, selected complex-valued coefficient signal components may be applied to the respective multipliers. Thus, again, as illustrated in FIG. 1, selected complex-valued coefficient signal components may be provided via MUXes 30 and 40 to multipliers 50 and 60, respectively. For this particular embodiment, the complex-valued coefficient signal components are stored in RAMs 120 and 130. Likewise, the two multiply-accumulate units are mutually coupled by two multiplexers, such as 30 and 40. Furthermore, the multiplexers are each coupled so as to provide an output signal to only one of the respective multipliers, such as 50 and 60. Furthermore, as previously described, in operation the signal sample components are provided serially. For example, in the previously described embodiment, although the invention is not limited in scope in this respect, first a current real-valued signal sample component is provided, next an imaginary-valued signal sample component is provided, then a selectively delayed real-valued signal sample component, and then a selectively delayed imaginary-valued signal sample component. However, these signal sample components may alternatively not be provided serially and may be provided in any order. Likewise, in the previously described embodiment, a signal sample component, such as provided via MUX 240, is provided to both multiply-accumulate units substantially simultaneously, although again the invention is limited in scope in this respect. Likewise, the two multiply-accumulate units are operated in a manner so as to implement a predetermined number of taps of the equalizer filter so that one of the two multiply-accumulate units produces a real-valued output signal and the other multiply-accumulate unit produces an imaginary-valued output signal. For example, as previously described for the embodiment illustrated in FIG. 1, the multiply-accumulate units operate at a clock frequency that exceeds the substantially predetermined signal sample rate by a factor of eight. Therefore, for this particular embodiment, four complex taps of the equalizer filter may be implemented by embodiment 100, although the invention is again not limited in scope in this respect.

While only certain features of the invention have been illustrated and described herein, many modifications, substitutions, changes or equivalents will now occur to those skilled in the art. It is, therefore, to be understood that the appended claims are intended to cover all such modifications and changes as fall within the true spirit of the invention.

The invention claimed is:

1. An equalizer filter configuration comprising:
a plurality of filter blocks, each filter block comprising two mutually-coupled multiply-accumulate units, and each of said two mutually-coupled multiply-accumulate units comprising a multiplexer;
a plurality of signal sample memory blocks, each signal sample memory block capable of supplying at least one of a complex-valued signal sample and a real-valued signal sample to the plurality of filter blocks; and
a plurality of coefficient memory blocks capable of storing a plurality of coefficient signals, each coefficient signal capable of altering a response of at least one of the plurality of filter blocks;
wherein the respective pluralities of signal sample memory blocks and filter blocks are coupled in said equalizer filter configuration to process input signal samples, the input signal samples comprising signal samples selected from the group comprising complex-valued signal samples and real-valued signal samples.

2. The equalizer filter configuration of claim 1,
wherein said multiplexer mutually couples the multiply-accumulate units so that the multiply-accumulate units include the capability to share multiplier signals stored in the two respective multiply-accumulate units.

3. The equalizer filter configuration of claim 1,
wherein said equalizer filter configuration is capable of providing equalizer filter output signals at a predetermined signal sample rate;
the mutually-coupled multiply-accumulate units of said filter blocks being configured so as to operate at a clock frequency exceeding said predetermined signal sample rate.

4. The equalizer filter configuration of claim 3,
wherein the clock frequency is approximately an integer multiple of the signal sample rate.

5. The equalizer filter configuration of claim 1,
wherein said memory blocks comprise random access memory (RAM) units.

6. An integrated circuit comprising an equalizer filter configuration including:

a plurality of filter blocks, each filter block comprising two mutually-coupled multiply-accumulate units, and each of said two mutually-coupled multiply-accumulate units comprising a multiplexer;
a plurality of signal sample memory blocks, each signal sample memory block capable of supplying at least one of a complex-valued signal sample and a real-valued signal sample to the plurality of filter blocks; and
a plurality of coefficient memory blocks capable of storing a plurality of coefficient signals, each coefficient signal capable of altering a response of at least one of the plurality of filter blocks; and
wherein the respective pluralities of signal sample memory blocks and filter blocks are coupled in said equalizer filter configuration to process input signal samples, the input signal samples comprising signal samples selected from the group comprising complex-valued signal samples and real-valued signal samples.

7. The integrated circuit of claim 6,
wherein said multiplexer mutually couples the multiply-accumulate units so that the multiply-accumulate units selectively share multiplier signals stored in the two respective multiply-accumulate units.

8. The integrated circuit of claim 6,
wherein said equalizer filter configuration is capable of providing equalizer filter output signals at a predetermined signal sample rate;
the mutually-coupled multiply-accumulate units of said filter blocks substantially operate at a clock frequency exceeding said substantially predetermined signal sample rate.

9. The integrated circuit of claim 8,
wherein the clock frequency is approximately an integer multiple of the signal sample rate.

10. The integrated circuit of claim 6,
wherein said memory blocks comprise random access memory (RAM) units.

11. A method of implementing an equalizer filter for processing complex-valued signal samples at a predetermined signal sample rate comprising the steps of:
providing current and selectively delayed real-valued and imaginary-valued signal sample components to the respective multipliers of two multiply-accumulate units, wherein the current and selectively delayed real-valued and imaginary-valued signal sample components are supplied from a plurality of signal sample memory blocks, each signal sample memory block capable of supplying at least one of a complex-valued signal sample and a real-valued signal sample to a plurality of filter blocks;
applying selected complex-valued coefficient signal components to said respective multipliers, wherein the selected complex-valued coefficient signal components are supplied from a plurality of coefficient memory blocks, each coefficient memory block is capable of storing a plurality of coefficient signals, and each coefficient signal is capable of altering a response of the plurality of filter blocks; and
operating the two multiply-accumulate units to implement a predetermined number of taps of the equalizer filter in which a first unit of the two multiply-accumulate units produces a real-valued output signal and a second unit of the two multiply-accumulate units produces an imaginary-valued output signal, wherein each of said two multiply-accumulate units comprises a multiplexer.

12. The method of claim 11,
wherein different respective signal sample components are provided serially.

13. The method of claim 12,
wherein a provided signal sample component is provided to both multiply-accumulate units substantially at the same time.

14. The method of claim 11,
wherein the selected complex-valued coefficient signal components are applied to said respective multipliers via said two multiplexers, said two multiplexers being mutually-coupled to provide a signal to only one of said respective multipliers.

15. The method of claim 11,
wherein the step of operating the two multiply-accumulate units comprises operating the two multiply-accumulate units at a clock frequency exceeding the predetermined signal sample rate.

16. The method of claim 15,
wherein the clock frequency is an integer multiple of the predetermined signal sample rate.

* * * * *